United States Patent [19]
Watanabe et al.

[11] Patent Number: 4,776,894
[45] Date of Patent: Oct. 11, 1988

[54] PHOTOVOLTAIC DEVICE

[75] Inventors: Kaneo Watanabe, Yawata; Yukio Nakashima, Hirakata, both of Japan

[73] Assignee: Sanyo Electric Co., Ltd., Moriguchi, Japan

[21] Appl. No.: 84,947

[22] Filed: Aug. 13, 1987

[30] Foreign Application Priority Data

| Aug. 18, 1986 | [JP] | Japan | 61-193452 |
| Aug. 19, 1986 | [JP] | Japan | 61-193655 |
| Aug. 20, 1986 | [JP] | Japan | 61-194504 |
| Aug. 20, 1986 | [JP] | Japan | 61-194505 |
| Nov. 10, 1986 | [JP] | Japan | 61-267212 |

[51] Int. Cl.$^4$ .......................................... H01L 31/06
[52] U.S. Cl. .................................. 136/249; 136/258; 357/30
[58] Field of Search ................. 136/249 TJ, 258 AM; 357/30 J, 30 K

[56] References Cited

U.S. PATENT DOCUMENTS

| 4,271,328 | 6/1981 | Hamakawa et al. | 136/249 |
| 4,385,199 | 5/1983 | Hamakawa et al. | 136/258 |
| 4,388,482 | 6/1983 | Hamakawa et al. | 136/258 |
| 4,476,346 | 10/1984 | Tawada et al. | 136/249 TJ |

FOREIGN PATENT DOCUMENTS

| 2545275 | 11/1984 | France | 136/249 TJ |
| 55-122783 | 7/1983 | Japan | 136/249 TJ |

OTHER PUBLICATIONS

Tsuda, S. et al., "Light-Induced Instability of Amorphous Silicon Photovoltaic Cells", *Solar Cells*, 9 (1983), pp. 25-36.

*Primary Examiner*—Aaron Weisstuch
*Attorney, Agent, or Firm*—Armstrong, Nikaido, Marmelstein & Kubovcik

[57] ABSTRACT

A first photovoltaic device according to the present invention comprises a plurality of unit photovoltaic cells layered in optical series, each unit photovoltaic cell including an optically active layer made of amorphous silicon and two impurity doped layers of opposite conductivity types arranged at opposite sides of the optically active layer; wherein a first impurity doped layer of a first unit photovoltaic cell located at the contact interface with a second unit photovoltaic cell is made of a first amorphous silicon alloy of first conductivity type, having an optically forbidden band width wider than that of amorphous silicon, and a second impurity doped layer of said second photovoltaic cell located at said contact interface is made of a second amorphous silicon alloy, different from said first amorphous silicon alloy, of opposite conductivity type from said first conductivity type, having an optically forbidden band width wider than that of the amorphous silicon.

A second photovoltaic device according to the present invention further comprises an additional impurity doper layer of either of the two conductivity types and made of non-monocrystalline ailicon, interposed between said first and second impurity layers.

14 Claims, 6 Drawing Sheets

PHOTOVOLTAIC DEVICE

BACKGROUND OF THE INVENTION

1. Field of the Invention

The present invention relates to a photovoltaic device wherein a plurality of unit photovoltaic cells is stacked in series.

2. Description of the Prior Art

As is disclosed in, for example, U.S. Pat. No. 4,271,328, there has been known a photovoltaic device of so-called tandem structure wherein two, three or more of unit photovoltaic cells each having a semiconductive junction such as p-i-n or p-n$^-$-n$^+$ are stacked in series. In such a photovoltaic device of tandem structure, the light which has passed a preceding unit photovoltaic cell from the incident side of the photovoltaic device without contributing photovoltaic action can be absorbed in a following unit photovoltaic cell so that the total photovoltaic efficiency can be improved. Further, if the width $E_{gopt}$ of an optically forbidden band of an optically active layer, such as the i-type layer in a p-i-n junction or the n$^-$type layer in a p-n$^-$-n$^+$ junction of a unit photovoltaic cell, which generates photocarriers mainly upon receiving an incident light is controlled, the peak wavelength in the photosensitivity thereof can be shifted so that the photovoltaic efficiency can be further improved.

Photocarriers (electrons and holes) generated in an optically active layer are attracted by a junction electric-field between the p-type and the n-type layers which sandwich the optically active layer. Namely, electrons are moved toward the n-type layer while holes are moved toward the p-type layer, and then they are collected and outputted. Therefore, in a unit photovoltaic cell, not only an undoped or lightly doped optically active layer such as an i-type layer or n$^-$-type layer contributes to the generation of electric power, but also impurity doped layers for generating a junction electric-field are required.

However, because each optically active layer is formed to be interposed in the path of incident light between impurity doped layers which are necessary for generating a junction electric-field, the amount of light reaching the optically active layer decreases if the absorption of light increases in the impurity doped layers and, therefore, this causes a serious decrease in the photovoltaic efficiency.

In a photovoltaic device disclosed in U.S. Pat. Nos. 4,385,199 or 4,388,482 comprising one unit photovoltaic cell and impurity layers, a so-called window layer arranged in front of an optically active layer at the light-impinging side is made of a wide-band gap material such as amorphous silicon carbide or amorphous silicon nitride which has a width $E_{gopt}$ of the optically forbidden band wider than that of the optically active layer in order to decrease the absorption of light in the window layer.

Therefore, if such a wide-band gap material effective for decreasing the absorption of light as mentioned above is used for the impurity doped layers required for generating a junction electric field which themselves scarcely contribute to the generation of electric power in a photovoltaic device of tandem structure, the absorption of light in the impurity layers can be decreased and, accordingly, the photovoltaic efficiency can be improved.

On the other hand, it has been known that the photovoltaic efficiency of a photovoltaic device made with amorphous silicon decreases when subjected to strong light irradiation for a long time. Even if the initial photovoltaic efficiency thereof can be improved by using a wide-band-gap material as mentioned above, the increase in the photovoltaic efficiency may be canceled when the temporal change thereof is serious and, further, it may happen that after a long period of time the photovoltaic efficiency becomes lower than that of a photovoltaic device of a prior-art structure. Therefore, researches for improving the photovoltaic efficiency and decreasing the temporal change have been conducted in parallel in recent years.

SUMMARY OF THE INVENTION

An essential object of the present invention is to provide a photovoltaic device having a so-called tandem structure which comprises a plurality of stacked unit photovoltaic cells, wherein the photovoltaic efficiency is much improved by using wide band gap materials for the impurity doped layers for generating a junction electric-layer and the temporal change can be minimized.

In order to accomplish the object of the present invention, there is provided a photovoltaic device according to the present invention comprising a plurality of unit photovoltaic cells layered in series in the direction of the propagation of light, each unit photovoltaic cell including an optically active layer made of amorphous silicon and two impurity doped layers of opposite conductivity types arranged at both sides of the optically active layer; wherein a first doped impurity layer of a unit photovoltaic cell at the contact interface with another unit photovoltaic cell is made of an amorphous silicon alloy of one of the two conductivity types, having an optically forbidden band width wider than that of amorphous silicon, and a second impurity doped layer of another photovoltaic cell at said contact interface is made of another amorphous silicon alloy different from said amorphous silicon alloy and of opposite conductivity type having an optically forbidden band width wider than that of amorphous silicon.

Further, according to the present invention, there is provided another photovoltaic device, comprising a plurality of unit photovoltaic cells layered in series in the direction of the propagation of light, each unit photovoltaic cell including an optically active layer made of amorphous silicon and two impurity doped layers of opposite conductivity types arranged at both sides of the optically active layer; wherein a first impurity layer of a unit photovoltaic cell at the contact interface with another unit photovoltaic cell is made of an amorphous silicon alloy of one of the two conductivity types, having an optically forbidden band width wider than that of amorphous silicon, a second impurity layer of another photovoltaic cell at said contact interface is made of another amorphous silicon alloy, different from said amorphous silicon alloy, of the opposite conductivity type than said conductivity type, having an optically forbidden band width wider than that of amorphous silicon, and a third impurity doped layer of either of the two conductivity types made of non-monocrystalline silicon is interposed between said first and second impurity doped layers.

In a photovoltaic device according to the present invention, two impurity layers are arranged so as to form a contact between adjacent unit photovoltaic cells which are made of different materials having respective band gaps wider than that of the optically active layer and having conductivity types opposite from each other. Thus, both impurity layers serve to transmit the incident light which has not been absorbed in the optically active layer of a preceeding unit photovoltaic cell toward the succeeding unit photovoltaic cell. Accordingly, light absorption by the impurity doped layers which generates a junction electric field but scarcely contributes to the generation of electric power can be decreased. Further, they serve effectively to suppress the temporal change. Therefore, the photovoltaic efficiency can be improved in cooperation with the suppression of the temporal change.

In another photovoltaic device according to the present invention, a non-monocrystalline silicon layer is arranged at the contact interface defined between adjacent unit photovoltaic cells. Thus, the absorption of light in the impurity doped layer is decreased and, at the same time, the junction quality between adjacent unit photovoltaic cells is improved. Thus, the amount of current can be increased without lowering the voltage, thereby increasing photovoltaic efficiency.

It is an advantage of the present invention to provide a photovoltaic device wherein the photovoltaic efficiency can be improved while the temporal change can be suppressed.

BRIEF DESCRIPTION OF THE DRAWINGS

Further objects and characteristics of the present invention will be understood with reference to the following description of the preferred embodiments and the accompanying drawings wherein.

DETAILED DESCRIPTION OF THE PREFERRED EMBODIMENTS

Figure 1:
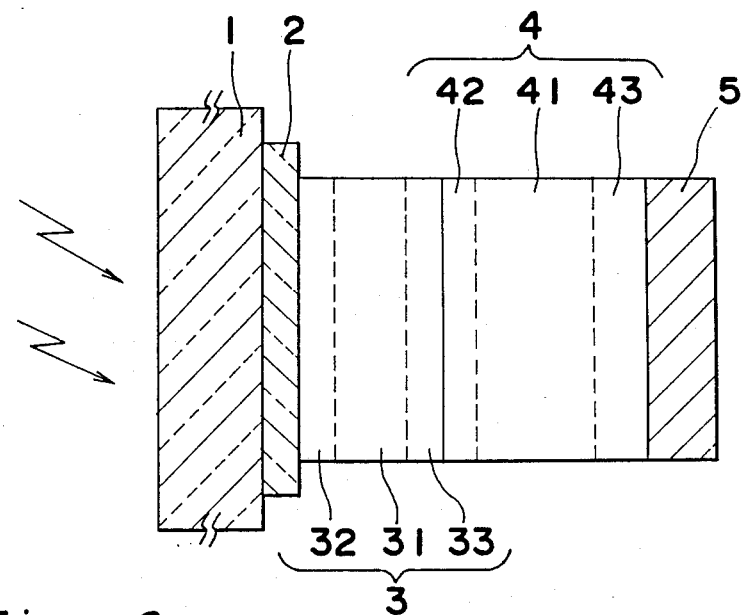
FIG. 1 is a schematic sectional view of an embodiment of a photovoltaic device according to the present invention.
Figure 2:
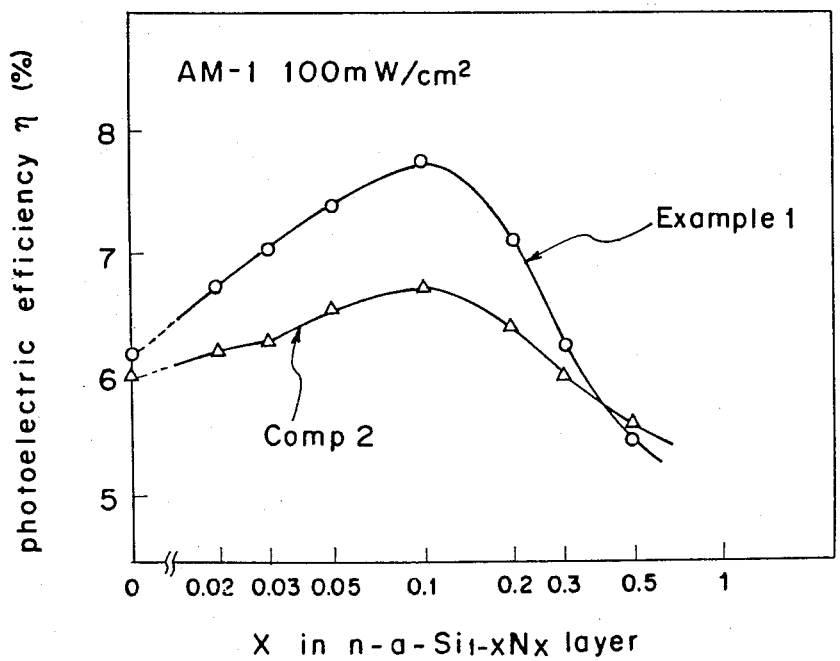
FIGS. 2, 3, 4 and 5 are respective graphs of the photovoltaic efficiency ($\eta$) plotted against the amount (x) of dopant impurity contained in an n-type impurity doped boundary layer of the first unit photovoltaic cell of a photovoltaic device according to the preferred embodiments of the present invention of a prior-art photovoltaic device.
Figure 3:
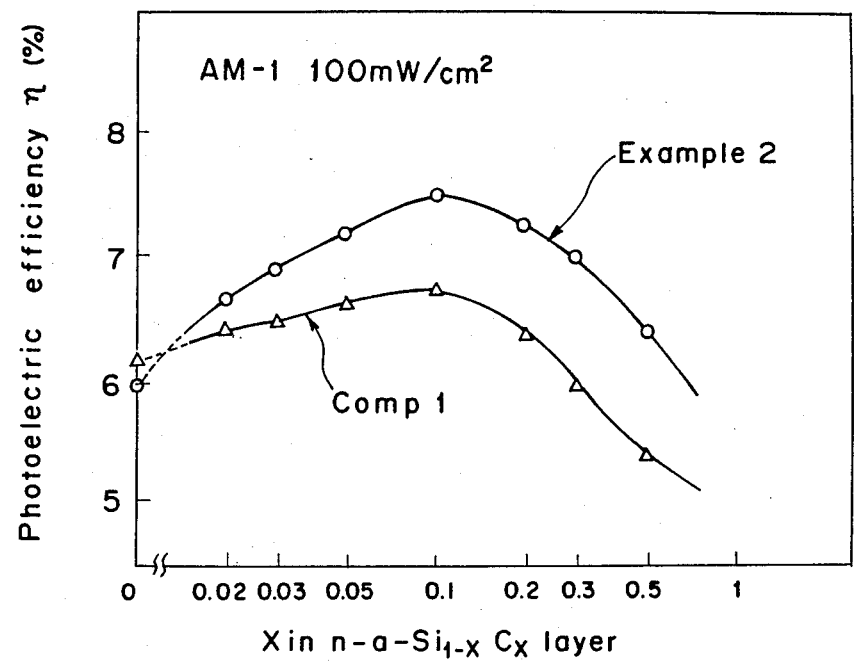
Figure 4:
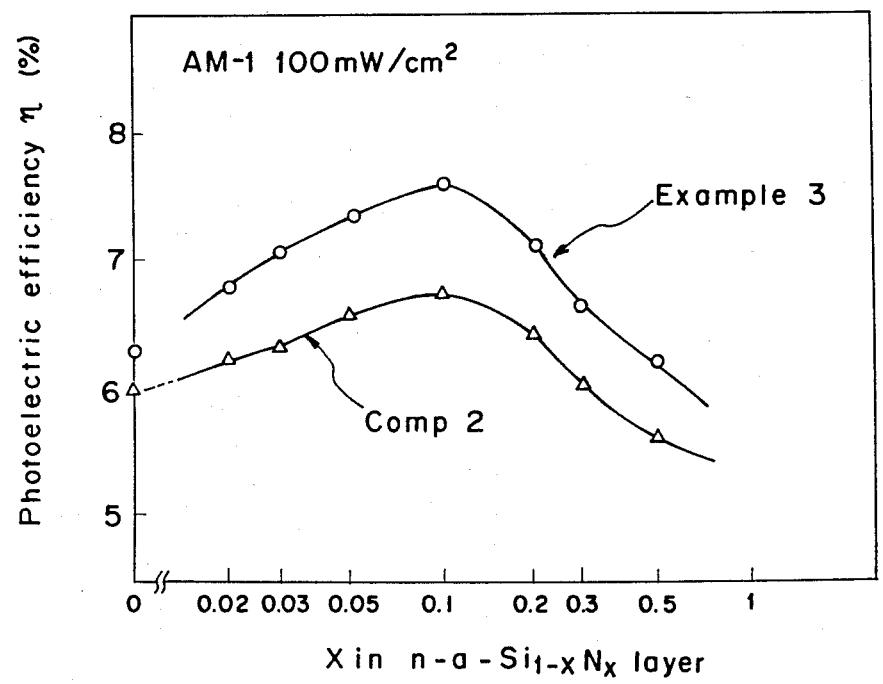
Figure 5:
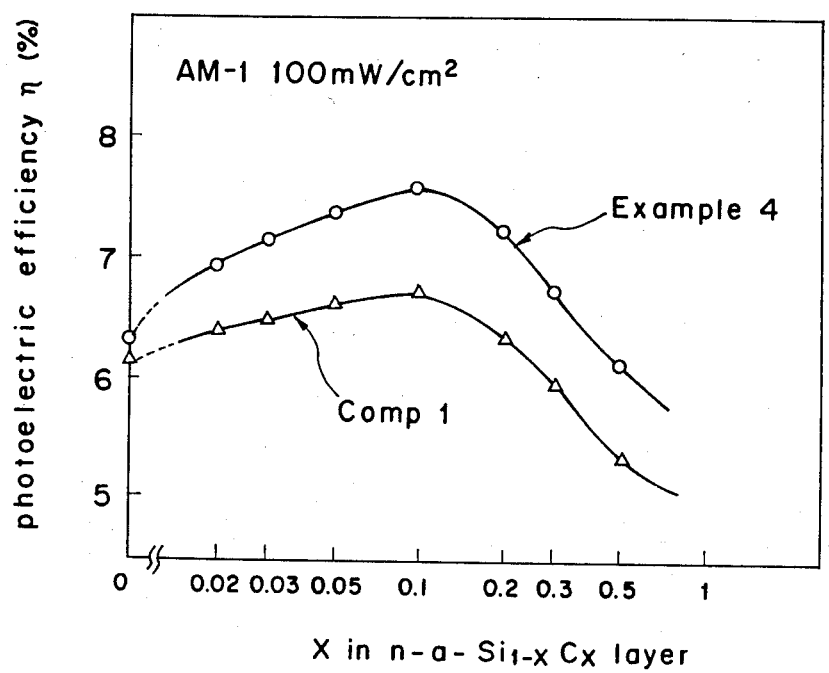
Figure 6:
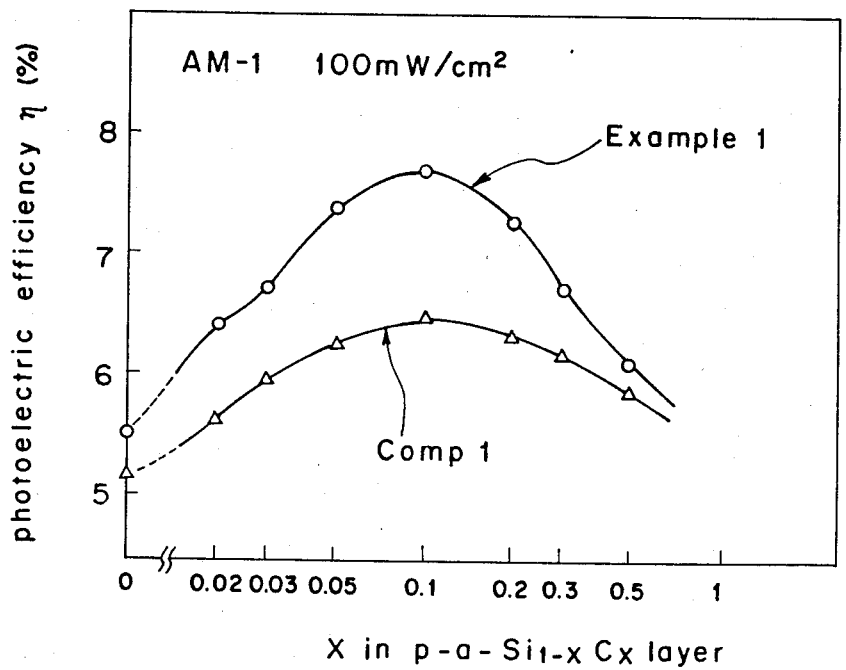
FIGS. 6, 7, 8 and 9 are respective graphs of the photovoltaic efficiency ($\eta$) plotted against the amount (x) of dopant impurity in a p-type impurity doped boundary layer of the second unit photovoltaic cell of a photovoltaic device according to the preferred embodiments of the present invention and of a prior-art photovoltaic device.
Figure 7:
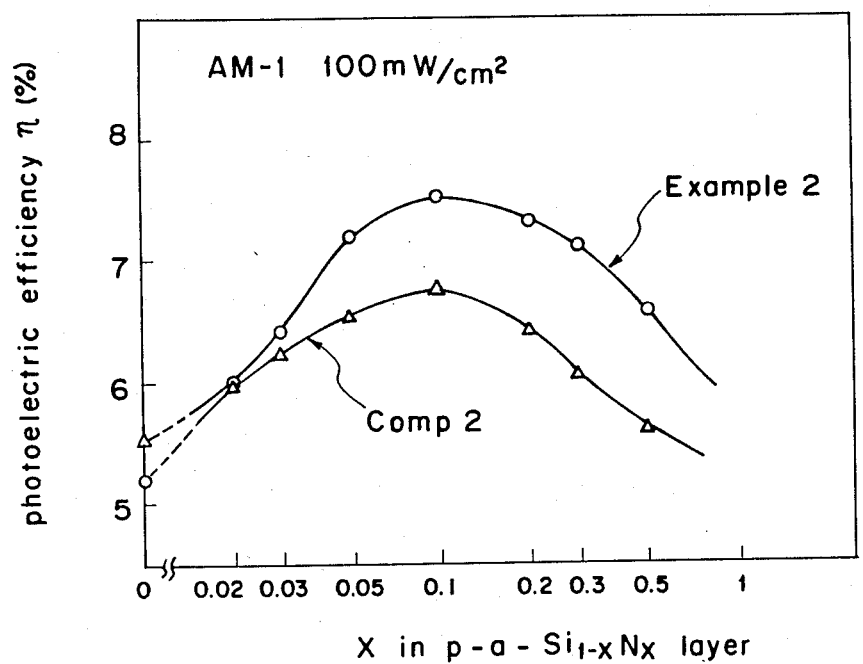
Figure 8:
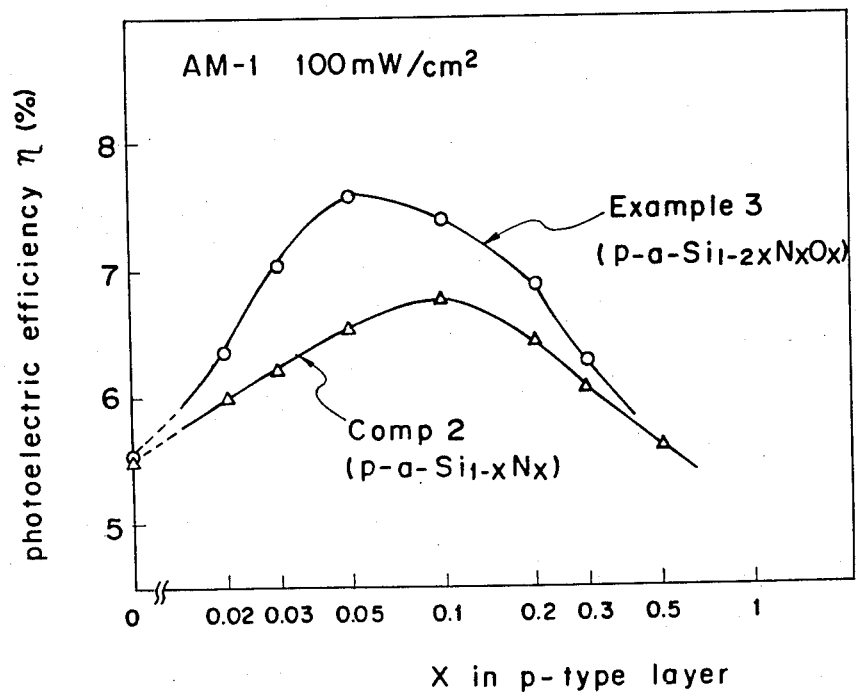
Figure 9:
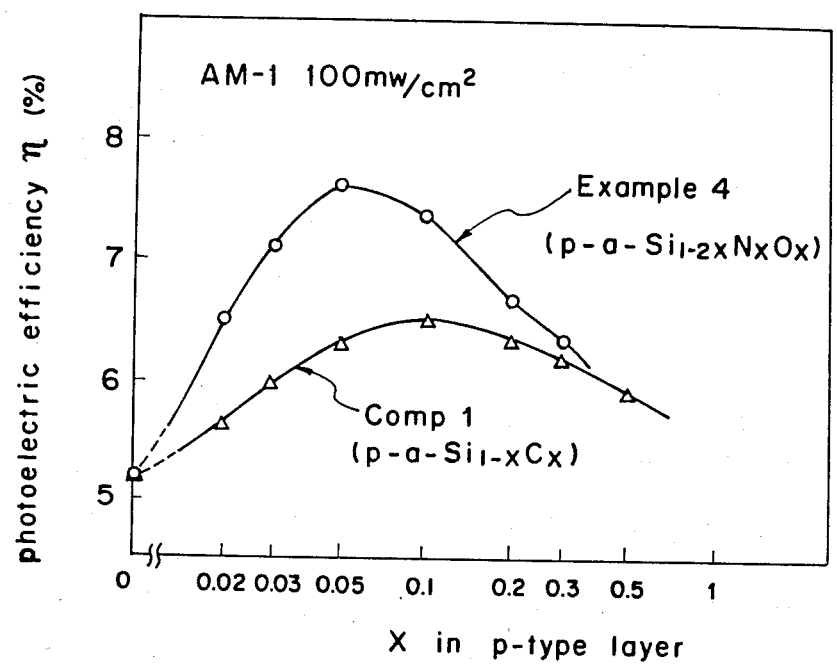

FIG. 1 is a schematic sectional view which shows the fundamental structure of a photovoltaic device of preferred embodiments according to the present invention. In this structure, a light-receiving-electrode 2 made of transparent and electrically conductive oxide (TCO) material such as indium-tin oxide (ITO) or tin oxide ($SNO_2$) is formed on a principal plane of a transparent and electrically insulating substrate 1 made of, for example, glass. Then, first and second unit photovoltaic cells 3 and 4 each of which can serve as an independent photovoltaic device are stacked on the light-receiving-electrode 2 one by one so as to contact the previous one at the side of its respective light-receiving surface. Then, a back electrode 5 having one, two or three layers each being made of Al, Ag, Al/Ti, Al/TiAg, TCO/Ag, TCO/Al/Ti or the like is applied on the back plane of the second unit photovoltaic cell 4.

Each of the first and second unit photovoltaic cells 3, 4 has a main body made of amorphous silicon (a-Si). This (a-Si) main body is formed according to a process such as plasma discharge or photodecomposition by a low pressure mercury lamp discharge which uses a raw material gas containing as a main material a gas selected from silicon compound gases such as $SiH_4+SiF_4$, $SiF_4$, $SiH_4$, $Si_2H_6$ and the like, mixed with a dopant impurity gas for controlling valence electrons of p-type or n-type such as $B_2H_6$, $PH_3$ or the like, and with a gas for forming a wide band gap semiconductor, such as $CH_4$, $C_2H_6$, $C_2H_2$, $NH_3$, NO or the like. Each unit photovoltaic cell 3 or 4 is composed of an optically active non-doped i-type layer 31 or 41 which is formed with use of raw material gas not containing dopant impurity gas for controlling valence electrons or a lightly doped layer containing a small amount of dopant impurities, a p-type impurity doped layer 32 or 43 and an n-type impurity doped layer 33 or 43 wherein the p-type and the n-type impurity doped layers are formed so as to sandwich the respective optically active layer 31 or 41 therebetween in order to generate a junction electric-voltage for urging the movement of photo-carriers generated in the optically active layer 31 or 41. Thus, both unit photovoltaic cells 3, 4 form a tandem p-i-n/p-i-n structure when observed from the light-entering side of the photovoltaic device. A tandem n-i-p/n-i-p structure when observed from the light-entering side of the photovoltaic device may also be used. Similarly, a tandem p-n⁻-n⁺ structure or the like may also be used.

One of the essential features of the present invention is that a combination of two or more kinds of wide band-gap materials is employed for forming the impurity layers 33, 42 defining an n/p or (p/n) contact interface of the first and second unit photovoltaic cells 3 and 4. The following materials are desirable for wide band-gap materials: silicon alloys such as amorphous silicon carbide (a-$Si_{1-x}C_x$), amorphous silicon nitride (a-$Si_{1-x}N_x$), amorphous silicon oxide (a-$SiO_x$) and amorphous silicon oxynitride (a-$Si_{1-2x}N_xO_x$), each of which has an optically forbidden band width wider than that of the first optically active layer 31, i.e. wider than about 1.8 eV. Any two of them are selected as the wide band-gap materials forming the impurity layers 33 and 42, respectively.

In the following embodiments (Examples 1-4), the following combinations are selected for the impurity layers 33, 42. In Example 1, a combination of n-type amorphous silicon nitride (a-$Si_{1-x}N_x$) and p-type amorphous silicon carbide (a-$Si_{1-x}C_x$) is selected. In Example 2, a combination of n-type amorphous silicon carbide (a-$Si_{1-x}C_x$) and p-type amorphous silicon nitride (a-$Si_{1-x}N_x$) is selected. In Example 3, a combination of n-type amorphous silicon nitride (a-$Si_{1-x}N_x$) and p-type amorphous silicon oxynitride (a-$Si_{1-2x}N_xO_x$) is selected. In Example 4, a combination of n-type amorphous silicon carbide (a-$Si_{1-x}C_x$) and p-type amorphous silicon oxynitride (a-$Si_{1-2x}N_xO_x$) is selected.

Photovoltaic devices according to the embodiments (Examples 1-4) and Comparison Examples 1 and 2 all have a tandem structure which is composed of the glass substrate 1, the TCO light-receiving-electrode 2, the first unit photovoltaic cell 3 or p-i-n junction type, the second unit photovoltaic cell 4 of p-i-n junction type and the Al back electrode 5.

Table 1 shows the compositions of Examples 1 to 4.

TABLE 1

| | | Composition of photovoltaic device | | | | | |
|---|---|---|---|---|---|---|---|
| | | first unit photovoltaic cell | | | second unit photovoltaic cell | | |
| layer | | 32 | 31 | 33 | 42 | 41 | 43 |
| conductivity type | | p | i | n | p | i | n |
| composition of layer | Ex 1 | a-Si$_{0.9}$C$_{0.1}$ | a-Si | a-Si$_{0.9}$N$_{0.1}$ | a-Si$_{0.9}$C$_{0.1}$ | a-Si | a-Si |
| | Ex 2 | a-Si$_{0.9}$C$_{0.1}$ | a-Si | a-Si$_{0.9}$C$_{0.1}$ | a-Si$_{0.9}$N$_{0.1}$ | a-Si | a-Si |
| | Ex 3 | a-Si$_{0.9}$C$_{0.1}$ | a-Si | a-Si$_{0.9}$C$_{0.1}$ | a-Si$_{0.9}$N$_{0.05}$O$_{0.05}$ | a-Si | a-Si |
| | Ex 4 | a-Si$_{0.9}$C$_{0.1}$ | a-Si | a-Si$_{0.9}$N$_{0.1}$ | a-Si$_{0.9}$N$_{0.05}$O$_{0.05}$ | a-Si | a-Si |
| thickness (Å) | | 150 | 800 | 100 | 100 | 4000 | 300 |

As shown in Table 1, in the first unit photovoltaic cell 3, the p-type layer 32 is an a-Si$_{0.9}$C$_{0.1}$ layer of thickness of 150 Å and the i-type layer 32 is an a-Si of thickness of 800 Å in the Examples, while the n-type layer 33 is a layer of thickness of 100 Å made of a material different from each other in every Example. On the other hand, in the second unit photovoltaic cell 4, the p-type layer 42 is a layer of thickness of 100 Å made of a different material in every Example, the i-type layer 41 is an a-Si layer of 4000 Å thickness, while the n-type layer 43 is an a-Si layer of 300 Å thickness. Only the compositions of the impurity doped layer (n-type layer) 33 of the first unit photovoltaic cell 3 and the impurity doped layer (p-type layer) 42 of the second unit photovoltaic cell 4 are different in the Examples as shown in Table 2, while compositions of all other constituent elements are common through the preferred embodiments (Examples 1-4) and the Comparison Examples 1 and 2. The p-type layer 32, the n-type layer 33 and the p-type layer 42 are made of wide-band-gap materials in order to increase the photovoltaic efficiency, while the n-type layer 43 is made of a-Si because the absorption of the light in the layer does not decrease the photovoltaic efficiency.

TABLE 2

| | Composition of layers 33 and 42 | |
|---|---|---|
| layer | 33 | 42 |
| Ex 1 | a-Si$_{0.9}$N$_{0.1}$ | a-Si$_{0.9}$C$_{0.1}$ |
| Ex 2 | a-Si$_{0.9}$C$_{0.1}$ | a-Si$_{0.9}$N$_{0.1}$ |
| Ex 3 | a-Si$_{0.9}$C$_{0.1}$ | a-Si$_{0.9}$N$_{0.05}$O$_{0.05}$ |
| Ex 4 | a-Si$_{0.9}$N$_{0.1}$ | a-Si$_{0.9}$N$_{0.05}$O$_{0.05}$ |
| Comp 1 | a-Si$_{0.9}$C$_{0.1}$ | a-Si$_{0.9}$C$_{0.1}$ |
| Comp 2 | a-Si$_{0.9}$N$_{0.1}$ | a-Si$_{0.9}$N$_{0.1}$ |

In Comparison Examples 1 and 2, materials having the same composition a-Si$_{0.9}$C$_{0.1}$ or a-Si$_{0.9}$N$_{0.1}$ but of conductivity types different from each other are used as impurity layers 33 and 42 defining the contact boundary surface therebetween.

The values of x of a-Si$_{1-x}$N$_x$, a-Si$_{1-x}$C$_x$, and a-Si$_{1-2x}$N$_x$O$_x$ of the embodiments and the Comparison Examples are controlled to be 0.1 so that the optically forbidden band width E$_{gopt}$ is wider than that of a-Si, i.e. greater than about 2.0 eV.

The unit photoelectric cells 3, 4 of the photoelectric devices used in the Examples and the Comparison Examples are manufactured by using a conventional plasma chemical vapor deposition (CVD) process of three separate chambers type, as disclosed, for example, in *Solar Cells*, 9, 1983, pp. 25-36, which is a conventional manufacturing method of a unit photovoltaic cell mainly composed of amorphous silicon. Table 3 shows the plasma CVD conditions used for the preparation of the layers 31-33, 41-43 of the photovoltaic devices of the Examples and the Comparison Examples. the composition of each layer is controlled by varying the kind and the ratio of raw material gases (CH$_4$, SiH$_4$, B$_2$H$_6$, PH$_3$ or NO). The following conditions are common: the frequency of the electric power source is 13.56 MHz, the flow rate of SiH$_4$ gas is 5-10 SCCM, and the gas pressure is 0.3-0.5 Torr.

TABLE 3

| | Manufacturing conditions in the plasma CVD process | | | |
|---|---|---|---|---|
| layer | RF power (W) | temperature of substrate (°C.) | composition of raw material gas | |
| 32 | 30 | 180 | CH$_4$/SiH$_4$ = 1 B$_2$H$_6$/SiH$_4$ = 0.01 | |
| 31 | 20 | 180 | SiH$_4$ = 100% | |
| 33 | 30 | 180 | Ex 1 | NH$_3$/SiH$_4$ = 0.1 PH$_3$/SiH$_4$ = 0.03 |
| | | | Ex 2 | CH$_4$/SiH$_4$ = 1 PH$_3$/SiH$_4$ = 0.04 |
| | | | Ex 3 | NH$_3$/SiH$_4$ = 0.1 PH$_3$/SiH$_4$ = 0.03 |
| | | | Ex 4 | CH$_4$/SiH$_4$ = 1 PH$_3$/SiH$_4$ = 0.04 |
| | | | Comp 1 | CH$_4$/SiH$_4$ = 1 PH$_3$/SiH$_4$ = 0.04 |
| | | | Comp 2 | NH$_3$/SiH$_4$ = 0.1 PH$_3$/SiH$_4$ = 0.03 |
| 42 | 30 | 220 | Ex 1 | CH$_4$/SiH$_4$ = 1 B$_2$H$_6$/SiH$_4$ = 0.01 |
| | | | Ex 2 | NH$_3$/SiH$_4$ = 0.1 B$_2$H$_6$/SiH$_4$ = 0.01 |
| | | | Ex 3 | NO/SiH$_4$ = 0.05 B$_2$H$_6$/SiH$_4$ = 0.01 |
| | | | Ex 4 | NO/SiH$_4$ = 0.05 B$_2$H$_6$/SiH$_4$ = 0.01 |
| | | | Comp 1 | CH$_4$/SiH$_4$ = 1 B$_2$H$_6$/SiH$_4$ = 0.01 |
| | | | Comp 2 | NH$_3$/SiH$_4$ = 0.1 B$_2$H$_6$/SiH$_4$ = 0.01 |
| 41 | 20 | 220 | SiH$_4$ = 100% | |
| 43 | 30 | 200 | PH$_3$/SiH$_4$ = 0.03 | |

TABLE 4

| | fundamental properties (initial values) | | | |
|---|---|---|---|---|
| | V$_{oc}$ (V) | I$_{sc}$ (mA) | FF (%) | η (%) |
| EX 1 | 1.65 | 6.7 | 70 | 7.74 |
| Ex 2 | 1.70 | 6.4 | 69 | 7.51 |
| Ex 3 | 1.65 | 6.6 | 70 | 7.62 |
| Ex 4 | 1.70 | 6.6 | 68 | 7.63 |
| Comp 1 | 1.65 | 6.3 | 65 | 6.76 |
| Comp 2 | 1.63 | 6.5 | 63 | 6.67 |

Table 4 compiles initial values of fundamental photovoltaic cell properties with respect to open circuit voltage V$_{oc}$ (V), short-circuit current I$_{sc}$ (mA), fill factor FF (%), and photovoltaic efficiency η (%) for the comparison of Examples according to the present invention with Comparison Examples of a prior-art structure. These values are measured by using a solar simulator which can illuminate a sample with light having a illumination amplitude of 100 mW/cm$^2$, substantially equal to that of the solar light (AM−1) at the Equator. It is apparent therefrom that the values of the photovoltaic efficiency and the fill factor FF are improved.

In Examples 1 and 2, the impurity doped layers 33, 42 defining the contact boundary surface between the first and second unit photovoltaic cell 3, 4 are made of different materials, a-Si$_{1-x}$C$_x$ and a-Si$_{1-x}$N$_x$, but having the same width $E_{gopt}$ of the optically forbidden band, whereas the impurity layers 33, 42 are made of the same material, a-Si$_{1-x}$C$_x$ or a-Si$_{1-x}$N$_x$, in Comparison Examples 1, 2. Thus, the data compiled in Table 4 show that the fundamental properties of a photovoltaic device can be improved by using different materials for the impurity layers 33, 42 as in Examples 1, 2 in contrast to Comparison Examples 1, 2 in which the same material is used therefor. Similarly, it is found that the fundamental properties are improved in Examples 3 and 4, wherein the impurity layers 33, 42 are also made of different materials.

Further, the temporal deterioration with respect to light and heat were measured with respect to the Examples and the Comparison Examples of the above-mentioned structures. In the light deterioration test, the photovoltaic efficiency is measured after the samples have been illuminated for five hours by an AM−1 light source having an amplitude of 500 mW/cm$^2$, which is five times larger than that of solar light 100 mW/cm$^2$ at the Equator, and the deterioration ratio relative to the initial value is calculated. In the heat deterioration test, the deterioration of the photovoltaic efficiency is measured after the samples have been exposed under heat conditions of 200° C. for fifty hours, and the deterioration ratio relative to the initial value is calculated. Table 5 compiles the results obtained.

TABLE 5

| | secular deterioration | |
|---|---|---|
| | light deterioration ratio | heat deterioration ratio |
| Ex 1 | 0.85 | 0.93 |
| Ex 2 | 0.83 | 0.95 |
| Ex 3 | 0.87 | 0.92 |
| Ex 4 | 0.86 | 0.91 |
| Comp 1 | 0.73 | 0.85 |
| Comp 2 | 0.75 | 0.87 |

It is apparent from Table 5 that the Examples 1–4 of the present invention are superior to the Comparison Examples 1, 2 not only in the fundamental properties of a photovoltaic device but also in the temporal changes due to light irradiation and heat which is characteristic of a photovoltaic cell mainly made of a-Si.

FIGS. 2 through 5 are graphs of the photovoltaic efficiency ($\eta$) of a photovoltaic device according to each of Examples 1–4 and Comparison Example 1 or 2 plotted against the amount (x) of nitrogen or carbon in the n-type impurity doped layer 33 or the first unit photovoltaic cell 3 for x=0, 0.02, 0.03, 0.05, 0.1, 0.2, 0.3 and 0.5. The p-type impurity doped layer 42 of the second unit photovoltaic cell 4 is the layer of the fixed composition shown in Table 2. For example, the p-type impurity layer 42 is a-Si$_{0.9}$C$_{0.1}$ in Example 1 and a-Si$_{0.9}$N$_{0.1}$ in Comparison Example 2 in FIG. 2.

It is confirmed from results obtained by the measurements as shown in FIGS. 2–5 that the photovoltaic efficiency ($\eta$) of a photovoltaic device according to the present invention is superior to that of either of comparison Examples 1 and 2 as long as the amount (x) of nitrogen or carbon in the n-type impurity layer 33 is kept equal to each other even when it is varied. It is found that the amount of an element besides silicon, such as nitrogen, contained in the impurity doped layer 33 is preferably 3–30%, more preferably 5–20%. It should be noted that the photovoltaic efficiency in Comparison Example 1 or 2 is somewhat superior to that of Examples 1 or 2 if the amount of nitrogen exceeds 0.5 in FIG. 2 or if that of carbon becomes less than 0.02 in FIG. 3. However, the temporal change of the photovoltaic efficiency is large in Comparison Example 1, 2 so that the photovoltaic efficiency in each of the Examples of the present invention becomes larger than that of Comparison Examples 1, 2 after a long time has passed.

Similarly, FIGS. 6–9 are graphs of the photovoltaic efficiency ($\eta$) of a photovoltaic device of each of the Examples 1–4 and Comparison Examples 1 or 2 plotted against the amount (x) of nitrogen, carbon or oxygen in the p-type impurity layer 42 at the interface of the second unit photovoltaic cell 4 for x=0, 0.02, 0.03, 0.05, 0.1, 0.2, 0.3 and 0.5. A layer having the fixed composition shown in Table 2 is used as the n-type impurity doped layer 33 of the first unit photovoltaic cell 3. For example, the n-type impurity doped layer 33 is a-Si$_{0.9}$N$_{0.1}$ in Example 1 and a-Si$_{0.9}$N$_{0.1}$ in Comparison Example 2 as shwon in FIG. 6.

It is confirmed from data obtained by the measurements as shown in FIGS. 6–9 that the photovoltaic efficiency ($\eta$) of a photovoltaic device according to the present invention is superior to that of Comparison Example 1 or 2 as long as the amount (x) of nitrogen or carbon in the p-type impurity doped layer 42 is kept equal to each other even when it is varied. It is found that the amount of the elements (besides silicon), such as nitrogen, contained in the impurity doped layer 42 is preferably 3–30%, more preferably 5–20%. It should be noted that the photovoltaic efficiency of the Comparison Example 2 is somewhat superior to that of Example 2 if the amount of nitrogen is less than 0.02 in FIG. 7 or to that of Example 4 if it exceeds 0.5 in FIG. 9. However, the temporal change of the photovoltaic efficiency is large in Comparison Example 2, so that the photovoltaic efficiency of the Examples according to the present invention becomes larger than that of Comparison 2 after a time has passed.

In the preferred embodiments explained above, the contact interface between adjacent unit photovoltaic cells 3, 4 forms a junction in the reverse polarity direction. Thus, the ohmic series connection property at the interface is not so good, and it causes a voltage drop. Therefore, even if wide band-gap materials are used for impurity doped layers at the interface in order to decrease the absorption of light in the layers, large enhancement of the photovoltaic efficiency cannot be realized because of the lowering in the ohmic contact properties.

Figure 10:
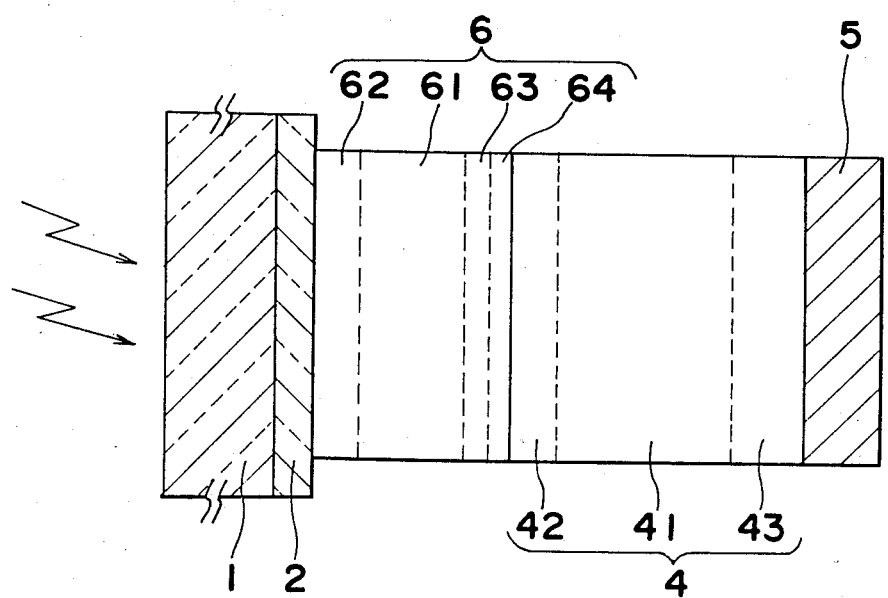
FIGS. 10, 11 and 12 are respective schematic sectional views of photovoltaic devices according to other preferred embodiments of the present invention.
Figure 11:
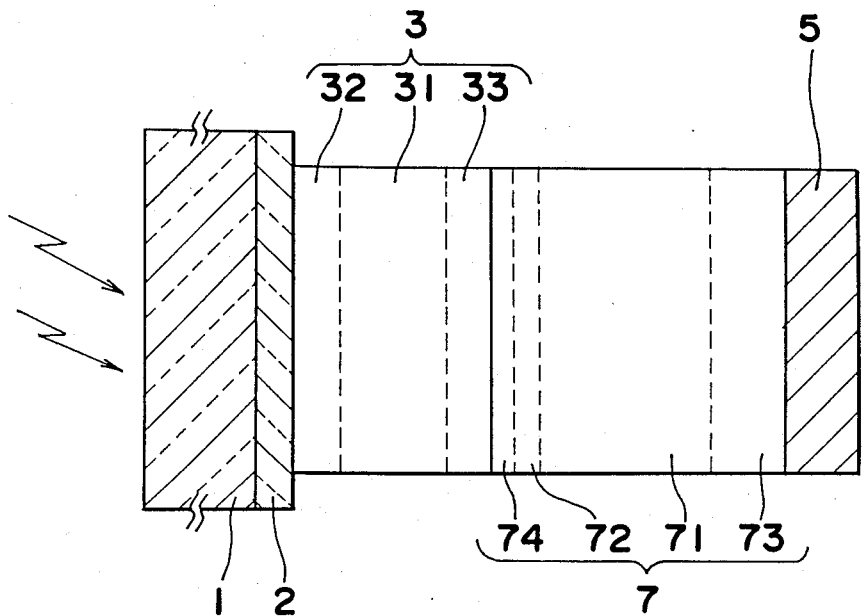
Figure 12:
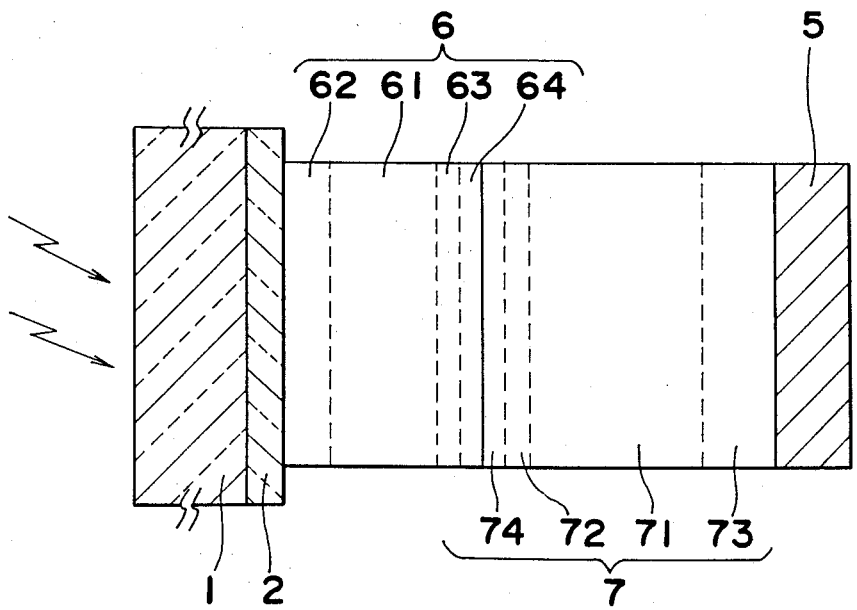

FIGS. 10–12 are schematic sectional views each of which shows a fundamental structure of a photovoltaic device according to modified embodiments of the present invention. In these modified embodiments, a transparent electrode 2 is first formed on one of the principal planes of a transparent and electrically insulating substrate 1. Then, a first unit photovoltaic cell 3 or 6 is applied at its light receiving side onto the electrode 2, and a second unit photovoltaic cell 4 or 7 is then applied on the first unit photovoltaic cell 3 or 6. Then, a back electrode 5 is applied on a back plane surface of the second unit photovoltaic cell 4 or 7. In any embodiment, at least one intermediate layer 64, 74 made of non-monocrystalline silicon such as amorphous silicon or microcrystalline silicon ($\mu$c-Si) of n-type or p-type conductivity is included at the contact interface.

Each of the first and second unit photovoltaic cells 3, 4, 6 and 7 has a structure which can independently function as a photovoltaic cell. Each unit cell is mainly made of amorphous silicon (a-Si). Each unit photovoltaic cell 3, 4, 6 or 7 is composed of an optically active layer 31, 41, 61 or 71 of an i-type or lightly doped layer, a p-type impurity doped layer 32, 42, 62, 72 or 74, and an n-type impurity doped layer 33, 43, 63, 64, 73, both p-type and n-type impurity layers sandwiching the respective optically active layer 31, 41, 61, 71. Thus, both unit photovoltaic cells 3, 4, 6, 7, form a tandem p-i-n-/p-i-n structure if observed from the light-entering side of the photovoltaic device. A tandem n-i-p/n-i-p structure observed from the light-entering side of the photovoltaic device may also be used. Similarly, a tandem p-n$^-$-n$^+$/p-n$^-$-n$^+$ structure or the like may also be used. In any tandem structure at least one intermediate layer 64 or 74 of amorphous silicon alloys is formed so as to form a sandwich structure.

A characteristic of these modified embodiments is the structure of both impurity doped layers at the n/p (or p/n) contact interface between an adjacent first unit photovoltaic type cell 3, 6 of p-i-n junction type and a second one 4, 7, that is, at least one amorphous silicon or microcrystalline silicon layer of n or p type conductivity is arranged between adjacent unit photovoltaic cells. For example, in the embodiment shown in FIG. 10, the n-type impurity doped layer of the first unit photovoltaic cell 6 at the contact interface has a double-layer structure which consists of a first layer 63 and a second layer 64, while in the embodiment shown in FIG. 11, the p-type impurity doped layer of the second unit photovoltaic cell 7 at the contact interface has a double-layer structure which consists of a layer 74 and layer 72. On the other hand, in the embodiment shown in FIG. 12 the impurity doped layers of both first and second unit photovoltaic cells 6, 7 at the contact interface have double-layer structures which consist of a first layer 63 and a second layer 64 and of a third layer 74 and a fourth layer 72, respectively. Thus, three layers and four layers lie between the two optically active layers of adjacent unit photovoltaic cells in the embodiments shown in FIGS. 10 and 11 and in FIG. 12, respectively. At least one intermediate layer of amorphous silicon or microcrystalline silicon of p or n type conductivity is included in them.

In these modified embodiments, a combination of two or more kinds of wide band-gap materials is selected as the impurity doped layers defining the contact interface, as in Examples 1-4. The wide band-gap materials include amorphous silicon alloys such as amorphous silicon carbide (a-Si$_{1-x}$C$_x$), amorphous silicon nitride (a-Si$_{1-x}$N$_x$), amorphous silicon oxide (a-SiO$_x$) and amorphous silicon oxynitride (a-Si$_{1-2x}$N$_x$O$_x$), having an optically forbidden band width greater than that of the first optically active layer 31, 61, i.e. greater than above 1.8 eV.

The following combinations are preferable: a combination of n-type amorphous silicon nitride (a-Si$_{1-x}$N$_x$) and p-type amorphous silicon carbide (a-Si$_{1-x}$C$_x$), a combination of n-type amorphous silicon carbide (a-Si$_{1-x}$C$_x$) and p-type amorphous silicon nitride (a-Si$_{1-x}$N$_x$), a combination of n-type amorphous silicon nitride (a-Si$_{1-x}$N$_x$) and p-type amorphous silicon oxynitride (a-Si$_{1-2x}$N$_x$O$_x$), a combination of n-type amorphous silicon carbide (a-Si$_{1-x}$C$_x$) and p-type amorphous silicon oxynitride (a-Si$_{1-2x}$N$_x$O$_x$).

Table 6 shows the construction of two embodiments (Examples 5 and 6), both having the structure shown in FIG. 10. The layers 62, 61, 42, 41, 43 in Examples 5 and 6 are the same as the counterparts 32, 31, 42, 41, 43 in Example 1, while the two n-type layers 63, 64 in Examples 5, 6 correspond to the single layer 33 in Example 1. The layer 63 is made of the same material as in the layer 33 in Example 1; however the thickness of the former is half that of the latter. The layer 64 is made of a-Si in Example 5, whereas it is made of $\mu$c-Si in Example 6.

Two samples (Comparison Example 3 and Example 1) are manufactured for comparison.

Examples 5, 6, and Comparison Example 3 and Example 1 all have the same constituent layers except for the construction of the interface shown in Table 7.

TABLE 6

| | | Structure of photovoltaic device | | | | | |
| | | first unit photovoltaic cell | | | | second unit photovoltaic cell | |
| layer | | 62 | 61 | 63 | 64 | 42 | 41 | 43 |
|---|---|---|---|---|---|---|---|---|
| conductivity type | | p | i | n | n | p | i | n |
| composition of layer | Ex 5 | a-Si$_{0.9}$C$_{0.1}$ | a-Si | a-Si$_{0.9}$N$_{0.1}$ | a-Si | a-Si$_{0.9}$C$_{0.1}$ | a-Si | a-Si |
| | Ex 6 | a-Si$_{0.9}$C$_{0.1}$ | a-Si | a-Si$_{0.9}$N$_{0.1}$ | $\mu$c-Si | a-Si$_{0.9}$C$_{0.1}$ | a-Si | a-Si |
| thickness (Å) | | 150 | 800 | 50 | 50 | 100 | 4000 | 300 |

TABLE 7

| | structure at the interface | | |
|---|---|---|---|
| layer | 63 | 64 | 42 |
| Ex 5 | a-Si$_{0.9}$N$_{0.1}$ | a-Si | a-Si$_{0.9}$C$_{0.1}$ |
| Ex 6 | a-Si$_{0.9}$N$_{0.1}$ | $\mu$c-Si | a-Si$_{0.9}$C$_{0.1}$ |
| Comp 3 | | a-Si | a-Si |
| Ex 1 | | a-Si$_{0.9}$N$_{0.1}$ | a-Si$_{0.9}$C$_{0.1}$ |

The first and second unit photovoltaic cells 6, 4 are manufactured by using the plasma CVD process of the three separate chamber type under the same conditions as those used for Examples 1-4 if not stated specifically. Table 8 shows the plasma CVD conditions for Examples 5, 6.

TABLE 8

| Manufacturing conditions in the plasma CVD process | | | |
|---|---|---|---|
| layer | RF power (W) | temperature of substrate (°C.) | composition of raw material gas |
| 62 | 30 | 180 | CH$_4$/SiH$_4$ = 1<br>B$_2$H$_6$/SiH$_4$ = 0.01 |
| 61 | 20 | 180 | SiH$_4$ = 100% |
| 63 | 30 | 180 | NH$_3$/SiN$_4$ = 0.1<br>PH$_3$/SiH$_4$ = 0.03 |
| 64 | | | |
| Ex 5 | 30 | 200 | PH$_3$/SiH$_4$ = 0.03 |
| Ex 6 | 50 | 220 | SiH$_4$/H$_2$ = 0.1 |

TABLE 8-continued

| | Manufacturing conditions in the plasma CVD process | | |
|---|---|---|---|
| layer | RF power (W) | temperature of substrate (°C.) | composition of raw material gas |
| 42 | 30 | 220 | PH$_3$/SiH$_4$ = 0.03<br>CH$_4$/SiH$_4$ = 1<br>B$_2$H$_6$/SiH$_4$ = 0.01 |
| 41 | 20 | 220 | SiH$_4$ = 100% |
| 43 | 30 | 200 | PH$_3$/SiH$_4$ = 0.03 |

TABLE 9

| | fundamental properties (initial values) | | | |
|---|---|---|---|---|
| | V$_{oc}$ (V) | I$_{sc}$ (mA) | FF (%) | η (%) |
| Ex 5 | 1.72 | 6.6 | 72 | 8.17 |
| Ex 6 | 1.74 | 6.7 | 71 | 8.28 |
| Comp 3 | 1.72 | 6.3 | 68 | 7.37 |
| Ex 1 | 1.65 | 6.7 | 70 | 7.74 |

TABLE 10

| | temporal deterioration | | |
|---|---|---|---|
| | initial value (%) | value after illumination (%) | value after heat treatment (%) |
| Ex 5 | 8.17 | 6.98 | 7.64 |
| Ex 6 | 8.28 | 7.10 | 7.75 |
| Comp 3 | 7.37 | 5.16 | 6.26 |
| Ex 1 | 7.74 | 6.58 | 7.20 |

Table 9 compiles the initial values of fundamental photovoltaic cell properties of open circuit voltage V$_{oc}$ (V), short-circuit current I$_{sc}$ (mA), fill factor FF (%) and photovoltaic efficiency η (%) for comparison of Examples 5, 6 of the structure of FIG. 10 according to the present invention with Comparison Example 3 and Example 1. These values are measured by using a solar simulator which illuminates a sample at an illumination amplitude of 100 mW/cm$^2$ similar to solar light (AM−1) at the Equator. It is apparent that the photovoltaic efficiency η is improved.

In Examples 5 and 6, the impurity doped layers 63, 42 at the interface between the first and the second unit photovoltaic cells 6, 4 are made of the same materials, a-Si$_{1-x}$C$_x$ and a-Si$_{1-x}$N$_x$, respectively, as those of Example 1; however, the layer 64 of a-Si$_1$ or μc-Si is interposed. The interposition of the layer 64 improves the open cell voltage V$_{oc}$, but it does not substantially change the short-circuit current I$_{sc}$. Thus, the photoelectric efficiency is improved.

Further, temporal deterioration was measured against light irradiation and heating of the Examples and the Comparison example of the above-mentioned structure. In the tests for the light deterioration, the photovoltaic efficiency was measured after the samples were illuminated for five hours by the AM−1 light of amplitude of 500 mW/cm$^2$, i.e. five times that of solar light 100 mW/cm$^2$ at the Equator. In the tests for heat deterioration, the deterioration of the photovoltaic efficiency was measured after the samples were subjected to heating at 200° C. for fifty hours. Table 10 compiles the data.

It is apparent from Table 10 that the Examples 5, 6 are superior to Comparison Example 3 and Example 1 in the temporal change due to light irradiation and heating which is characteristic of a photovoltaic cell made mainly from a-Si.

Through the above-mentioned Examples 1-6 have a tandem structure which consists of two unit photovoltaic cells, the present invention can also be applied to a tandem structure which consists of three or more unit photovoltaic cells.

The preferred embodiments described herein are illustrative and not restrictive, the scope of the invention being indicated by the appended claims and all variations which come within the meanings of the claims are intended to be embraced herein.

What is claimed is:

1. A photovoltaic device comprising a plurality of unit photovoltaic cells stacked in optical series, each unit photovoltaic cell including an optically active layer made of amorphous silicon and two impurity doped layers of opposite conductivity types arranged at opposite sides of the optically active layer, characterized in that the impurity doped layer of one unit photovoltaic cell which is located at the contact interface with an adjacent unit photovoltaic cell is made of a first amorphous silicon alloy of one of the two conductivity types, said impurity doped layer having an optically forbidden band width wider than that of amorphous silicon, and the opposite conductivity type impurity doped layer of said adjacent unit photovoltaic cell which is located at said contact interface is made of a second amorphous silicon alloy different from said first amorphous silicon alloy and having an optically forbidden band width wider than that of amorphous silicon.

2. A photovoltaic device according to claim 1, wherein said first and second amorphous silicon alloys are selected from amorphous silicon nitride, amorphous silicon carbide, amorphous silicon oxynitride, and amorphous silicon oxide.

3. A photovoltaic device according to claim 2, wherein said first and second amorphous silicon alloy layers located at the contact interface are made of amorphous silicon nitride of n-type and amorphous silicon carbide of p-type, respectively.

4. A photovoltaic device according to claim 2, wherein said first and second amorphous silicon alloy layers located at the contact interface are made of amorphous silicon carbide of n-type and amorphous silicon nitride of p-type, respectively.

5. A photovoltaic device according to claim 2, wherein said first and second amorphous silicon alloy layers located at the contact interface are made of amorphous silicon nitride of n-type and amorphous silicon oxynitride of p-type, respectively.

6. A photovoltaic device according to claim 2, wherein said first and second amorphous silicon alloy layers located at the contact interface are made of amorphous silicon carbide of n-type and amorphous silicon oxynitride of p-type, respectively.

7. A photovoltaic device according to any one of claims 3-6, wherein the amount of the nitrogen, carbon, and/or oxygen is between 3-30% in said first and second amorphous silicon alloys.

8. A photovoltaic device according to claim 7, wherein the amount of nitrogen, carbon, and/or oxygen is between 5-20% in said first and second amorphous silicon alloys.

9. A photovoltaic device comprising a plurality of unit photovoltaic cells stacked in optical series, each unit photovoltaic cell including an optically active layer made of amorphous silicon and two impurity doped layers of opposite conductivity types arranged at opposite sides of the optically active layer, characterized in that the impurity doped layer of one unit photovoltaic cell which is located at the contact interface with an adjacent unit photovoltaic cell is made of a first amorphous silicon alloy of one of the two conductivity types, said impurity doped layer having an optically forbidden band width wider than that of amorphous silicon, and the opposite conductivity type impurity doped layer of said adjacent unit photovoltaic cell which is located at said contact interface is made of a second amorphous silicon alloy having an optically forbidden band width wider than that of amorphous silicon, and an impurity doped layer of either of the two conductivity types made of non-monocrystalline silicon is interposed between said first and second impurity doped amorphous silicon alloy layers.

10. A photovoltaic device according to claim 9, wherein said non-monocrystalline silicon impurity doped layer is either of amorphous silicon or microcrystalline silicon.

11. A photovoltaic device according to claim 9, further comprising a second impurity doped layer made of non-monocrystalline silicon of conductivity type opposite that of the first non-monocrystalline silicon layer interposed between the first non-monocrystalline silicon layer and the first or second amorphous silicon alloy layer of same conductivity type.

12. A photovoltaic device according to claim 11, wherein said second non-monocrystalline silicon layer is either of amorphous silicon or microcrystalline silicon.

13. A photovoltaic device according to any one of claims 9-11, wherein said first and second amorphous silicon alloys are selected from amorphous silicon carbide, amorphous silicon nitride, amorphous silicon, and amorphous silicon oxynitride.

14. A photovoltaic device according to claim 13, wherein said first and second amorphous silicon alloys are different from each other.

* * * * *